(12) United States Patent
Yoshida

(10) Patent No.: US 6,368,936 B1
(45) Date of Patent: Apr. 9, 2002

(54) METHOD FOR FORMING A SEMICONDUCTOR INTEGRATED CIRCUIT

(75) Inventor: Yoshifumi Yoshida, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/444,430

(22) Filed: Nov. 19, 1999

(30) Foreign Application Priority Data

Nov. 20, 1998 (JP) ............................................ 10-331691

(51) Int. Cl.$^7$ ............................................... H01L 21/76
(52) U.S. Cl. .................... 438/401; 438/412; 438/462; 438/479; 438/975; 438/439; 438/149; 257/797
(58) Field of Search ................................. 438/401, 462, 438/975, 479, 412, 439, 149; 257/797

(56) References Cited

U.S. PATENT DOCUMENTS

| | | | | |
|---|---|---|---|---|
| 5,369,050 A | * | 11/1994 | Kawai | 438/401 |
| 5,436,173 A | * | 7/1995 | Houston | 438/155 |
| 5,914,510 A | * | 6/1999 | Hieda | 257/301 |
| 6,048,774 A | * | 4/2000 | Yamamoto et al. | 438/406 |
| 6,215,197 B1 | * | 4/2001 | Iwamatsu | 257/797 |

FOREIGN PATENT DOCUMENTS

| | | | | |
|---|---|---|---|---|
| EP | 0513684 A2 | * | 11/1992 | H01L/23/544 |
| JP | 2000156506 A | * | 6/2000 | H01L/29/78 |

* cited by examiner

*Primary Examiner*—Matthew Smith
*Assistant Examiner*—B. V. Keshavan
(74) *Attorney, Agent, or Firm*—Adams & Wilks

(57) ABSTRACT

An alignment mark is formed in an SOI substrate comprised of a support substrate, an insulating layer and a semiconductor film by etching through first oxide and nitride films formed on the semiconductor film and etching through the semiconductor film and the insulating layer so that the hole extends to the support substrate. The first oxide film is formed on the semiconductor film and the first nitride film is formed thereover. The first nitride film is etched to expose part of the first oxide film and a well is formed in the semiconductor film by ion implantation in the region where the first nitride film is etched. The alignment mark is then formed by etching through the first nitride film, the first oxide film, the semiconductor film and the insulation layer so that the hole extends to the support substrate. Remaining portions of the first nitride film and the first oxide film are removed and second oxide and nitride films are formed on the semiconductor film. The second nitride film is etched to form openings therein in desired areas and LOCOS films are formed by oxidizing the openings. Remaining portions of the second nitride film are then removed. A deep alignment mark is thus formed, making it easy to perform alignment during processing.

11 Claims, 6 Drawing Sheets

PRIOR ART
FIG.5A
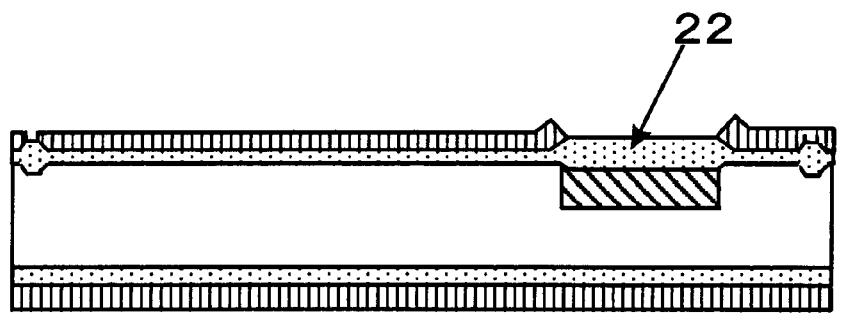
FIG.5B
FIG.5C
FIG.5D
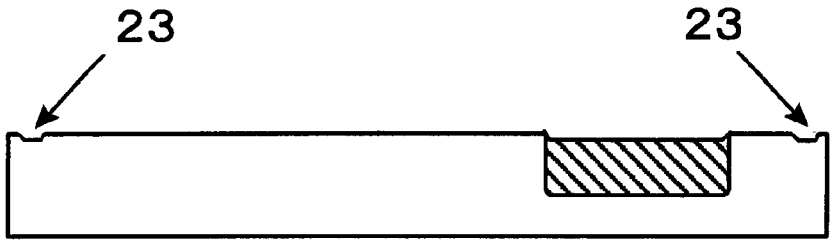
FIG.5E
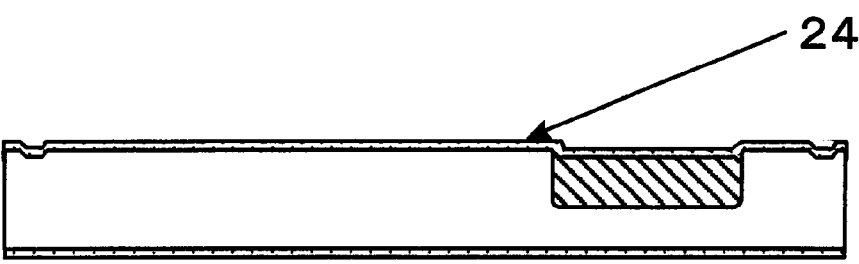

METHOD FOR FORMING A SEMICONDUCTOR INTEGRATED CIRCUIT

BACKGROUND OF THE INVENTION

The present invention relates to a method for forming an alignment mark required when forming a CMOS transistor on a semiconductor film provided on a support substrate through an insulation film.

There is shown in FIG. 4A to FIG. 6E a conventional method for forming an alignment mark used in forming a CMOS transistor. On a semiconductor substrate 20, an oxide film 21 is formed to 500 angstroms and further a nitride film 5 is formed to 1000 angstroms on the oxide film. Next, a resist 6 is applied and patterned on the nitride film 5 to form an opening 8 for forming a well. At this time, an alignment mark 7 is also formed. The alignment mark 7 is also an opening in the nitride film. Next, ion implantation for formation of a well 9 is conducted with the resist 6 and nitride film 5 serving as a mask, wherein ions are implanted penetrating through the oxide film 21 in the opening 8 formed in the nitride film 5. Further, as shown in FIG. 5A, an oxide film 22 is formed on the ion-implanted semiconductor substrate 20 to 3000 angstroms using the nitride film 5 as a mask. At this time, oxidation is effected in an alignment 7 area. This oxidation process is required to provide on the semiconductor substrate 20 a step for an alignment mark 7 serving as a mark for alignment utilized in a succeeding LOCOS forming process. Next, as shown in FIGS. 5B and 5C, the nitride film 5 is removed to perform well drive-in. Further, the oxide films 22 with the film thickness of 3000 angstroms are removed from the areas of the well 9 and alignment mark 7. This forms a step (recess) 23 for an alignment mark to approximately 1000 angstroms on the semiconductor substrate (FIG. 5D). Next, an oxide film 24 is formed to 350 angstroms on the semiconductor substrate (FIG. 5E), and a nitride film 12 is further formed thereon to 1600 angstroms as shown in FIG. 6A. Next, a resist 13 is applied on the nitride film 13 and then patterned matched to the alignment mark 23 with a recess of approximately 1000 angstroms formed on the semiconductor substrate 20. This patterning is for LOCOS formation. Then, the nitride film 12 is etched to remove the nitride film 12 from areas 14 where a LOCOS 15 is formed. At this time, a LOCOS 15 is also formed in an alignment mark 25 area. Next, as shown in FIG. 6D, oxidation is made to 5500 angstroms in areas 14 for LOCOS formation where nitride film 12 has been removed. This forms oxide films as LOCOS 15 to 5500 angstroms in areas not covered by the nitride film 12. Further, an oxide film is formed to 5500 angstroms for an alignment mark 25. Accordingly, the alignment mark is given a step (convex) of approximately 2000 angstroms. Next, as shown in FIG. 6E, the nitride film 12 is removed and further the oxide film 24 is removed from areas not formed with LOCOS 15, followed by advancing to a gate oxide film forming process. It should be noted that, in alignment processes from now on, patterning will be conducted matched to convex form of approximately 2000 angstroms formed in the LOCOS process.

In the conventional CMOS transistor forming method, there are oxide film forming processes in a total thickness of about 3500 angstroms before performing the well drive-in process. Here, if these oxide film forming processes are implemented by thermal oxidation, oxidation advances also in a thickness direction of the semiconductor substrate. If the conventional CMOS forming method is conducted on an SOI wafer having a semiconductor film thickness of from 200 to 3000 angstroms on an insulation film, the oxide film advances in a depth direction of the semiconductor film during an oxide film forming process. This results in a change of the entire semiconductor film region into an oxide film before the well drive-in process. In order to avoid such a disadvantage, it is a known practice to take a measure of reducing the oxide film thickness during the oxide film forming processes to be conducted after an ion implant process for well formation. In the conventional CMOS transistor forming process, however, steps (recesses) made upon removing, after oxide film formation, an oxide film from areas of wells and alignment marks are utilized as alignment marks in a succeeding process. Consequently, with such a measure of reducing oxide film thickness, a formed alignment mark is small in step (recess) size. Due to this, it is difficult to confirm the alignment marks upon implementing alignment in later process steps.

Meanwhile, although convex-formed alignment marks are also formed in the process of forming LOCOS, the formation of LOCOS advances oxidation also in the depth direction of a semiconductor film. Accordingly, for a wafer with a semiconductor film of 200 to 3000 angstroms, LOCOS will connect an insulation film on a support substrate, making it impossible to increase LOCOS thickness. Accordingly, the alignment marks are smaller in step dimension. Thus, there has been difficulty in implementing patterning with such alignment marks in the process of forming LOCOS and the later steps.

SUMMARY OF THE INVENTION

It is therefore an object of the present invention to form an alignment mark that is to be confirmed in later processes.

In order to solve the above-mentioned problems, the present invention comprises: a step of forming an oxide film on a semiconductor film of 200 to 3000 angstroms provided on a support substrate through an insulation film, a step of forming a nitride film on the oxide film, a step of etching the nitride film, a step of performing ion implantation through an opening in the etched nitride film to form a well, a step of etching the nitride film, the oxide film, the semiconductor film and the insulation film on the support substrate to reach a part of the support substrate to form an alignment mark, a step of removing the nitride film and the oxide film and forming a new oxide film and a new nitride film, a step of etching the new nitride film, a step of oxidizing where the new nitride film has been etched in an opening area to form a LOCOS, and a step of removing the new nitride film. Due to this, an alignment mark is formed also on the SOI wafer support substrate. This eliminates the disadvantage that the alignment mark is small in step size and hence impossible to confirm as having been encountered so far in the method of forming a recess-formed alignment mark in an oxidation film process before well drive-in.

Meanwhile, a convex-formed alignment mark is formed in a process of forming LOCOS. For a wafer with a semiconductor film of 200 to 3000 angstroms, however, the formation of LOCOS advances oxidation also in a depth direction of the semiconductor film, resulting in connection with an insulation film on the support substrate. Consequently, a disadvantage is eliminated that the thickness of LOCOS cannot be increased and a mark is difficult to confirm with an alignment due to a small step in the alignment mark. The present invention has an effect to eliminate this disadvantage.

BRIEF DESCRIPTION OF THE DRAWINGS

FIGS. 5A to 5E are a process flow view (2) showing a manufacturing method of the related art;

DETAILED DESCRIPTION OF THE PREFERRED EMBODIMENT

Now an embodiment of the present invention will be described with reference to FIG. 1 to FIG. 3.

Figure 1A:
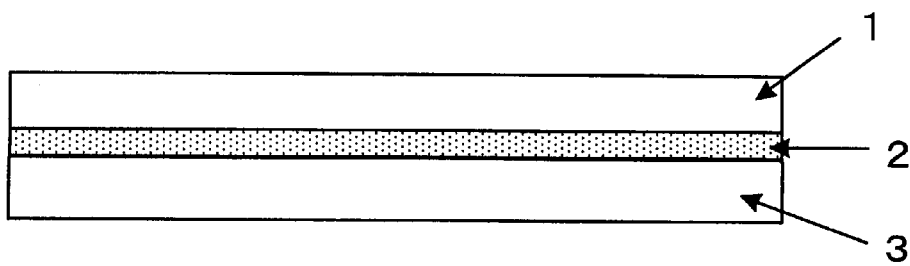
FIGS. 1A to 1E are a process flow view (1) showing a manufacturing method of the present invention.
Figure 1B:
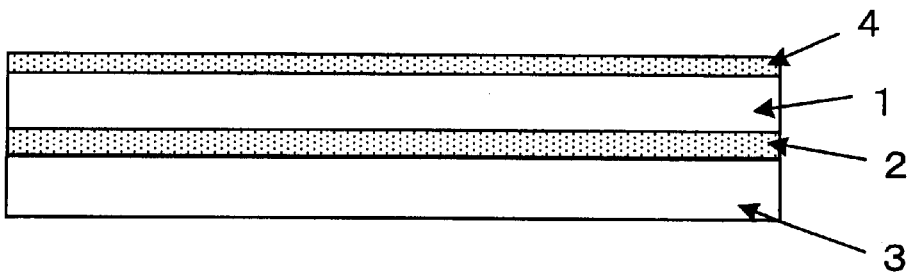
Figure 1C:
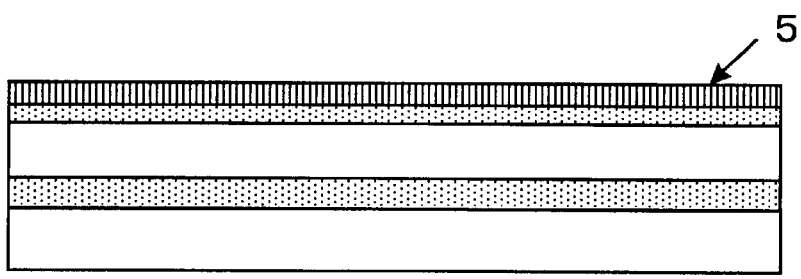
Figure 1D:
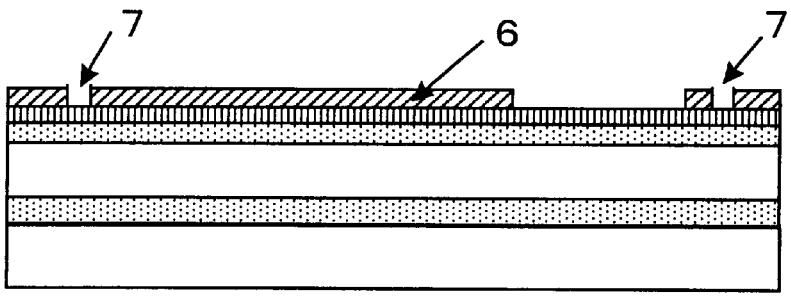
Figure 1E:
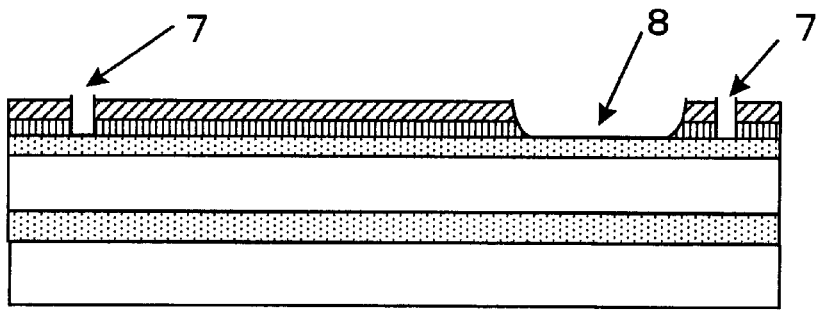
Figure 2A:
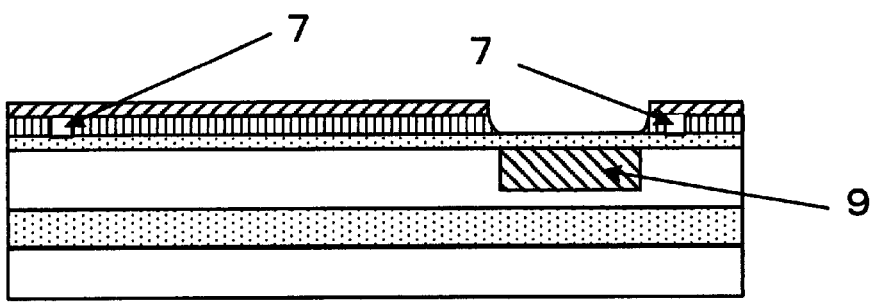
FIGS. 2A to 2E are a process flow view (2) showing a manufacturing method of the invention.
Figure 2B:
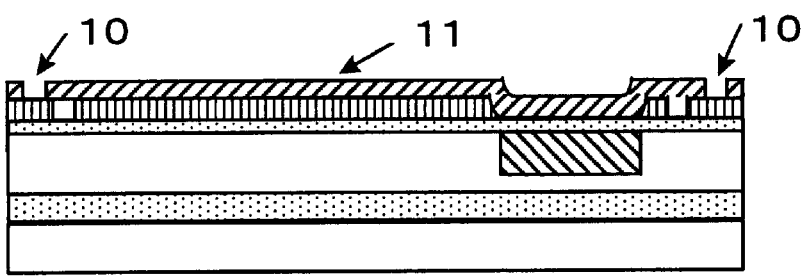
Figure 2C:
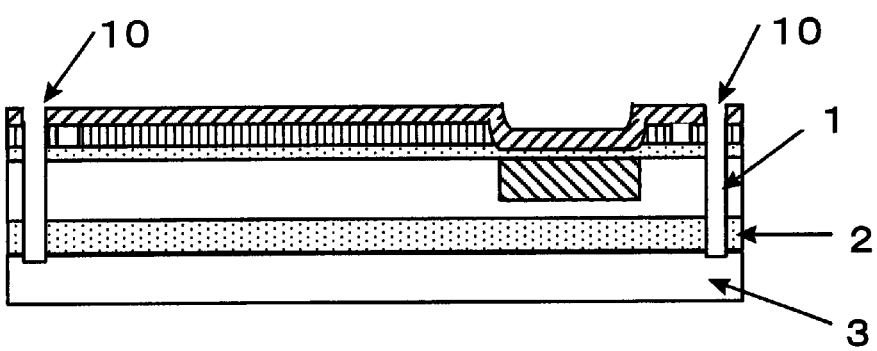
Figure 2D:
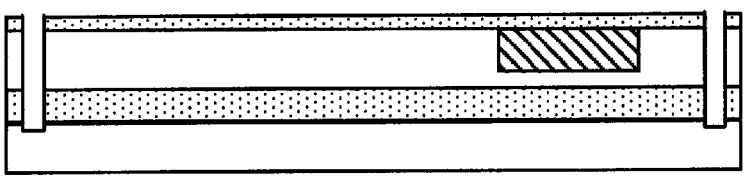
Figure 2E:
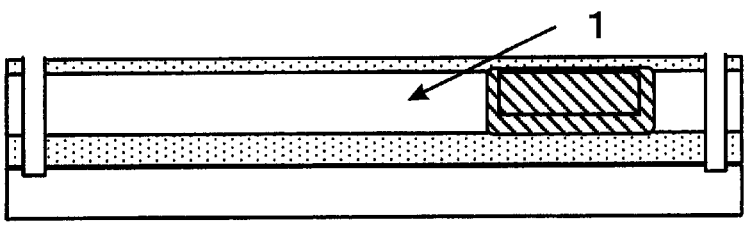
Figure 3A:
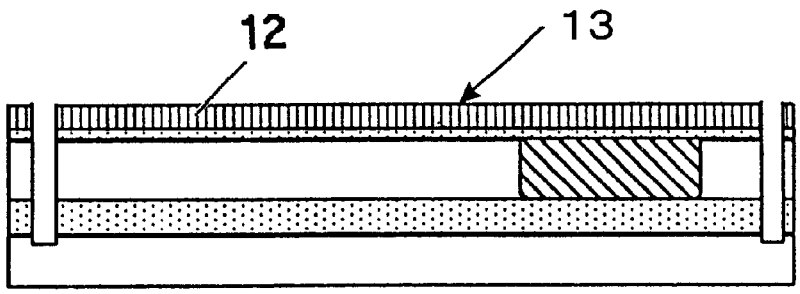
FIGS. 3A to 3E are a process flow view (3) showing a manufacturing method of the invention.
Figure 3B:
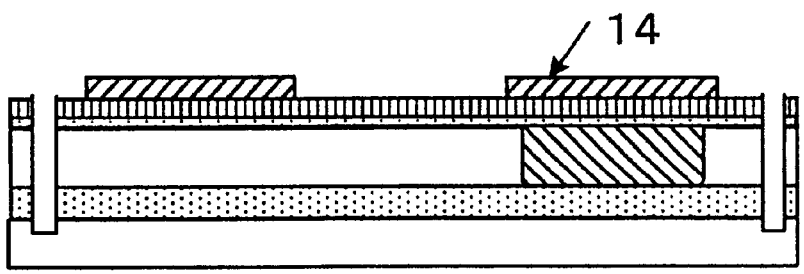
Figure 3C:
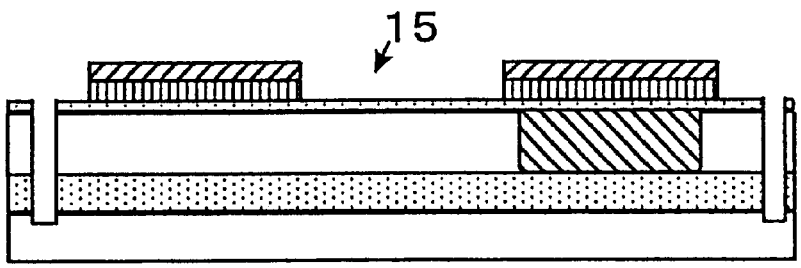
Figure 3D:
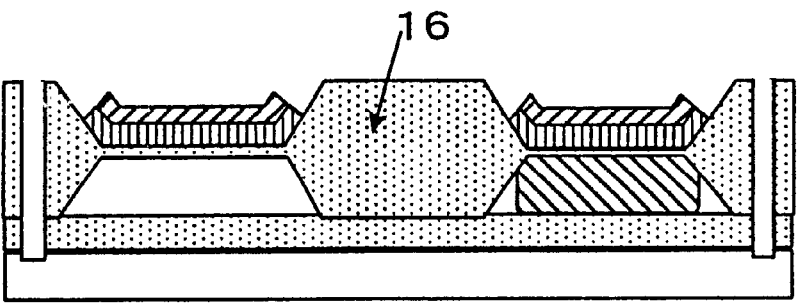
Figure 3E:
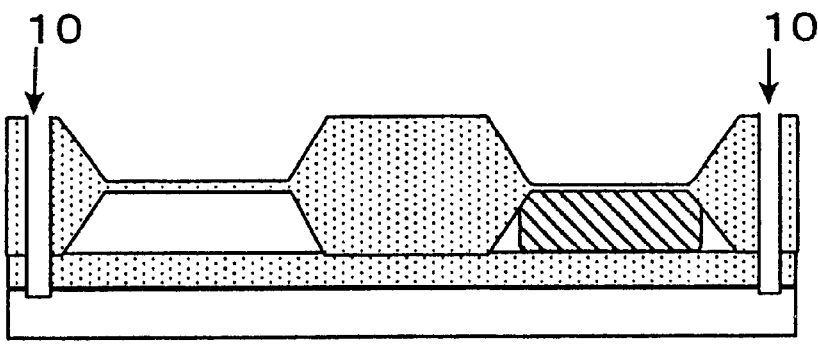
Figure 4A:
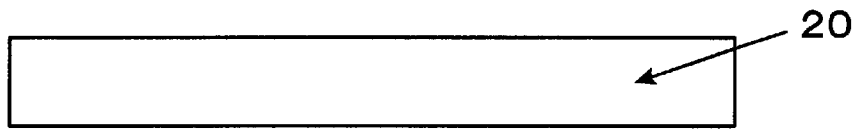
FIGS. 4A to 4F are a process flow view (1) showing a manufacturing method of the related art.
Figure 4B:
Figure 4C:
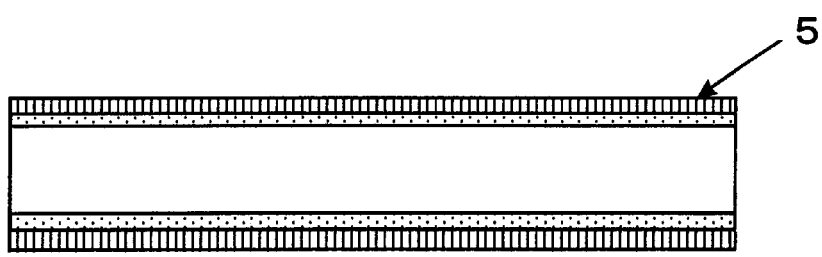
Figure 4D:
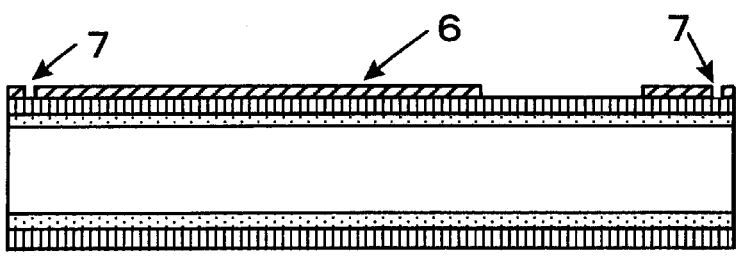
Figure 4E:
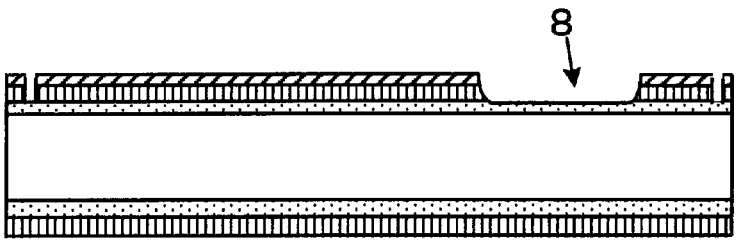
Figure 4F:
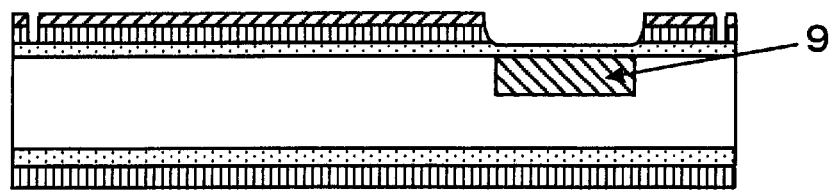
Figure 6A:
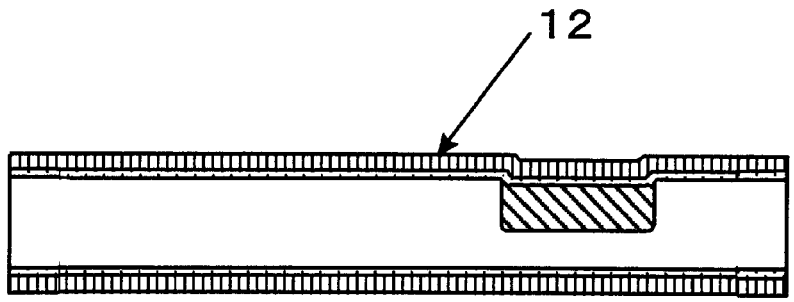
FIGS. 6A to 6E are a process flow view (3) showing a manufacturing method of the related art.
Figure 6B:
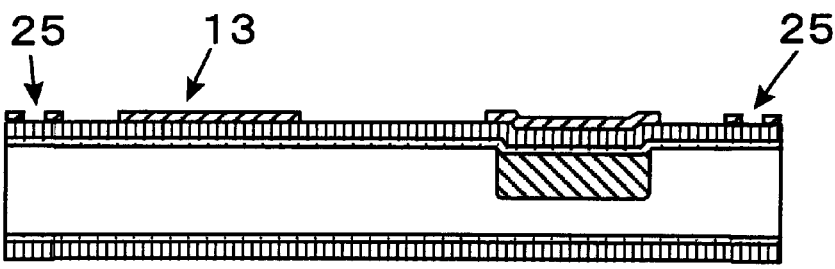
Figure 6C:
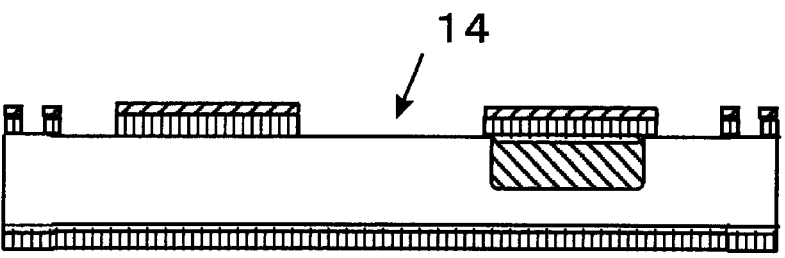
Figure 6D:
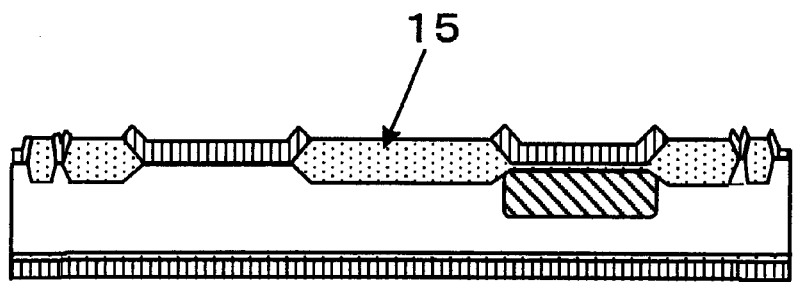
Figure 6E:
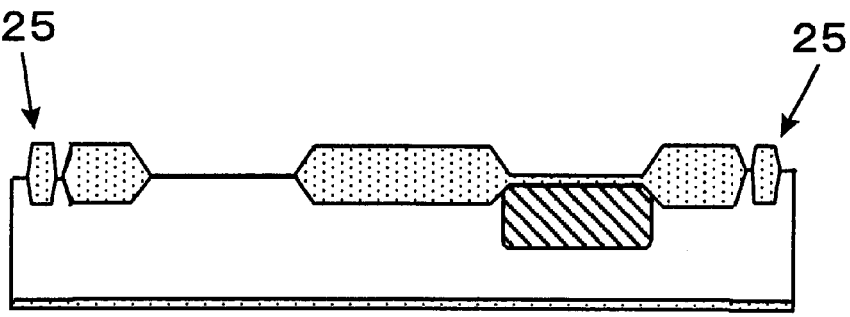

Referring first to FIG. 1A, an SOI wafer includes a semiconductor film 1 formed in a thickness of 200 to 3000 angstroms on a support substrate 3 through an insulation film 2, on which a thermal oxide film 4 is formed to a thickness of approximately 100 angstroms (FIG. 1B). This thermal oxide film 4 is required in order to form a nitride film 5 in a next process and reduce damage to the substrate upon conducting well ion implant. Next, as shown in FIG. 1C, a nitride film 5 is formed to approximately 1600 angstroms on the oxide film 4. The nitride film 5 serves as a mask when implanting ions for forming a well. After forming the nitride film 5, a resist 6 is applied onto the nitride film 5, followed by being patterned (FIG. 1D). Next, as shown in FIG. 1E, the nitride film 5 is etched to form an opening 8 for ion implantation to form a well 9. At this time, an alignment mark 7 is also etched to form a recess with a thickness of the nitride film 5. Next, as shown in FIG. 2A, ion implantation is conducted through the oxide film 4 utilizing the nitride film 5 as a mask. This allows ions to be implanted only through the opening 8 of the nitride film 5. Next, as shown in FIG. 2B, patterning is made for an alignment mark 10. By applying a resist 11, alignment and exposure is conducted with the alignment mark 7 formed on the nitride film 5. Thereafter, dry etching is made down to a part of the support substrate 3 by penetrating through the nitride film 5, oxide film 4, semiconductor film 1 and insulation film 2 on the support substrate, as shown in FIG. 2C. This process results in an alignment mark formed through all the films on the support substrate 3. Next, as shown in FIGS. 2D and 2E, the nitride film 5 is removed to perform well drive-in. At this time, well drive-in is performed in a nitrogen atmosphere in order to prevent against oxide film formation that would reduce the film thickness of the semiconductor film 1. Next, as shown in FIG. 3A, a process for forming a LOCOS 16 is commenced. A thermal oxide film 12 is formed to approximately 160 angstroms on the wafer after performing well drive-in, and thereon a nitride film 13 is formed to approximately 1600 angstroms. Next, a resist 14 is applied to conduct alignment and exposure with the dry-etched alignment mark 10 (FIG. 3B), thereby patterning for a LOCOS 16. Next, the nitride film 13 is etched to provide an opening 15 in a LOCOS forming area (FIG. 3C). The wafer in this state is placed in a thermal oxidation oven to form a LOCOS 16. The LOCOS 16 is formed such that a LOCOS thickness reaches the insulation film 2 on the support substrate 3 (FIG. 3D). After forming the LOCOS 16, the nitride film 13 is removed. Further, the oxide film in other areas than the LOCOS 16 is entirely removed, followed by advancing to a gate oxidation process. It should be noted here that, in the alignment processes on and after a gate oxidation process, alignment will be made with the etch-formed alignment mark 10 which penetrates through the semiconductor film 1 and the insulation film 2 on the support substrate 3 and has a recess partly on the support substrate 3.

In the present invention, the semiconductor film 1 on the insulation film has a thickness of 200 to 3000 angstroms. This is because an oxidation film is formed to approximately 300 angstroms during thermal oxidation in the above processes, and a MOS transistor cannot be formed on the semiconductor film 1 unless at least the semiconductor film 1 has a thickness of 200 angstroms or greater. Also, the alignment marks 7 and 10 if not formed with a step of approximately 1000 angstroms are difficult to confirm. Here, if the alignment mark is formed to have a step of 1000 angstroms by the conventional MOS transistor manufacturing method, the thickness of an oxide film to be formed before a LOCOS 16 forming process will be approximately 6000 angstroms. Consequently, in the case of an oxide film thickness of approximately 6000 angstroms, the formation of a MOS transistor on a semiconductor film requires a semiconductor film thickness of approximately 3000 angstroms. For a greater thickness of the semiconductor film 1 than this, it is possible for the conventional alignment mark forming method to be used. Accordingly, the semiconductor film thickness applicable to the present invention is 200 to 3000 angstroms.

The present invention is to be practiced in the form as explained above, and has the following effects.

The present invention comprises: a step of forming an oxide film on a semiconductor film of 200 to 3000 angstroms provided on a support substrate through an insulation film; a step of forming a nitride film on the oxide film; a step of etching the nitride film; a step of performing ion implantation through an opening in the etched nitride film to form a well, a step of etching the nitride film, the oxide film, the semiconductor film and the insulation film on the support substrate through down to reaching a part of the support substrate to form an alignment mark; a step of removing the nitride film and the oxide film and forming a new oxide film and a new nitride film; a step of etching the new nitride film; a step of oxidizing the etched new nitride film in an opening area to form a LOCOS; and a step of removing the new nitride film. In this manner, an alignment mark is also formed on the SOI wafer support substrate. This eliminates the disadvantage that the alignment mark is small in step size and hence impossible to confirm in the method for forming a recess-formed alignment mark in an oxidation film process before well drive-in. Also, a convex-formed alignment mark is formed in a process of forming LOCOS. For a wafer with a semiconductor film of 200 to 3000 angstroms, however, the formation of LOCOS advances oxidation also in a depth direction of the semiconductor film, resulting in connection with an insulation film on the support substrate. Consequently, there has been a disadvantage that the thickness of LOCOS cannot be increased and an alignment mark is difficult to confirm due to a small step in the alignment mark. The present invention eliminates this disadvantage.

What is claimed is:

1. In a method for manufacturing a semiconductor integrated circuit in which a CMOS transistor is formed on an SOI wafer having a semiconductor film with a thickness of 200 to 3000 angstroms provided on a support substrate through an insulation film, the steps comprising:

a step of forming a first oxide film on the semiconductor film;

a step of forming a first nitride film on the first oxide film;

a step of etching the first nitride film to form an open area therein exposing the first oxide film;

a step of performing ion implantation to implant ions in the semiconductor film through the first oxide film in the open area to form a well in the semiconductor film;

a step of forming an alignment mark by etching a hole through the first nitride film, the first oxide film, the semiconductor film and the insulation film so as to reach the support substrate;

a step of removing remaining portions of the first nitride film and the first oxide film;

a step of forming a second oxide film on the semiconductor film and a second nitride film on the second oxide film;

a step of etching the second nitride film to form an opening therein exposing the second oxide film;

a step of performing oxidation using the second nitride film as a mask so that oxidation occurs in the opening formed in the second nitride film to form a LOCOS film; and a step of removing remaining portions of the second nitride film.

2. A method for manufacturing a semiconductor integrated circuit according to claim 1; wherein the step of etching the second nitride film to form an opening is performed by etching the opening in the second nitride film directly adjacent the well formed in the semiconductor film so that devices formed in the well are isolated by the LOCOS film from devices formed in other regions of the semiconductor film.

3. A method for manufacturing a semiconductor integrated circuit according to claim 1; wherein the step of forming the first oxide film is performed first, followed by a sequence of steps comprising, in order, the step of forming the first nitride film, the step of etching the first nitride film, the step of performing ion implantation, the step of forming the alignment mark, the step of removing remaining portions of the first nitride film and the first oxide film, the step of forming the second oxide film and the second nitride film, the step of etching the second nitride film, the step of performing oxidation, and the step of removing remaining portions of the second nitride film.

4. A method of forming an alignment mark during fabrication of an SOI type integrated circuit on a wafer having a support substrate, a first insulating film provided on the support substrate and a semiconductor film provided on the first insulating film, comprising the steps of:

forming a second insulating film comprising oxide and nitride layers on the semiconductor film and patterning the second insulating film to form an opening therein;

forming a well in the semiconductor film by doping an impurity in the opening formed in the second insulating film;

forming the alignment mark by etching a hole through the second insulating film, the semiconductor film and the first insulating film so that the hole extends to the support substrate;

removing remaining portions of the second insulating film;

forming a third insulating film comprising oxide and nitride layers and patterning the third insulating film to form openings therein where LOCOS regions are to be formed on the semiconductor film; and forming the LOCOS regions.

5. A method of forming an alignment mark according to claim 4; wherein the semiconductor film has a thickness in the range of about 200 to 3000 angstroms.

6. A method of forming an alignment mark according to claim 4; wherein the step of forming and patterning the second insulating film comprises the steps of forming a first oxide film on the semiconductor film, forming a first nitride film on the oxide film, and etching the first nitride film to form the opening therein.

7. A method of forming an alignment mark according to claim 6; wherein the step of forming the well comprises the step of performing ion implantation to implant ions in the semiconductor film through the first oxide film in the opening formed in the first nitride film.

8. A method of forming an alignment mark according to claim 6; wherein the step of forming and patterning the third insulating film comprises the steps of forming a second oxide film on the semiconductor film and forming a second nitride film on the second oxide film, and etching the second nitride film to form the openings.

9. A method of forming an alignment mark according to claim 8; wherein the step of forming the LOCOS regions comprises the step of performing oxidation using the second nitride film as a mask so that oxidation occurs in the openings formed in the second nitride film.

10. A method of forming an alignment mark according to claim 9; further comprising the step of removing remaining portions of the second nitride film after performing the oxidation.

11. A method of forming an alignment mark according to claim 4; wherein the step of forming a second insulating film is performed first, followed by a sequence of steps comprising, in order, forming the well in the semiconductor film, forming the alignment mark, removing remaining portions of the second insulating film, forming a third insulating film and patterning the third insulating film, and forming the LOCOS regions.

* * * * *